(12) United States Patent
Mehas et al.

(10) Patent No.: US 8,159,276 B2
(45) Date of Patent: Apr. 17, 2012

(54) METHOD FOR USING DIGITAL PLL IN A VOLTAGE REGULATOR

(75) Inventors: Gustavo James Mehas, Sunnyvale, CA (US); Sandeep Agarwal, Fremont, CA (US); Jayant Vivrekar, San Jose, CA (US); Xiaole Chen, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 205 days.

(21) Appl. No.: 12/564,466

(22) Filed: Sep. 22, 2009

(65) Prior Publication Data

US 2010/0007391 A1 Jan. 14, 2010

Related U.S. Application Data

(63) Continuation of application No. 11/951,565, filed on Dec. 6, 2007, now Pat. No. 7,592,846.

(60) Provisional application No. 60/890,285, filed on Feb. 16, 2007, provisional application No. 60/890,286, filed on Feb. 16, 2007.

(51) Int. Cl.
*H03L 7/06* (2006.01)
(52) U.S. Cl. .................................. 327/158; 327/147
(58) Field of Classification Search .................. 327/149, 327/158
See application file for complete search history.

(56) References Cited

U.S. PATENT DOCUMENTS

| | | | |
|---|---|---|---|
| 5,654,657 A * | 8/1997 | Pearce | 327/163 |
| 6,285,726 B1 * | 9/2001 | Gaudet | 375/376 |
| 6,683,928 B2 * | 1/2004 | Bhullar et al. | 375/374 |
| 7,046,060 B1 * | 5/2006 | Minzoni et al. | 327/158 |
| 7,088,158 B2 * | 8/2006 | Block et al. | 327/158 |
| 7,106,114 B2 * | 9/2006 | Taniguchi | 327/158 |
| 7,173,462 B1 * | 2/2007 | Wang | 327/158 |
| 7,271,634 B1 * | 9/2007 | Daga et al. | 327/149 |
| 7,321,254 B2 * | 1/2008 | Li et al. | 327/534 |
| 7,349,507 B2 * | 3/2008 | Maddux | 375/355 |
| 7,400,181 B2 * | 7/2008 | Metz et al. | 327/149 |
| 7,425,858 B1 * | 9/2008 | Daga | 327/279 |
| 7,433,441 B2 * | 10/2008 | Jenkins et al. | 375/371 |
| 7,577,224 B2 * | 8/2009 | Eldredge | 375/373 |
| 7,592,846 B2 * | 9/2009 | Mehas et al. | 327/158 |
| 2002/0033737 A1 * | 3/2002 | Staszewski et al. | 331/17 |
| 2002/0057118 A1 * | 5/2002 | Tang | 327/158 |
| 2002/0175771 A1 * | 11/2002 | Cyrusian | 331/25 |
| 2006/0119420 A1 * | 6/2006 | Li et al. | 327/538 |
| 2006/0140321 A1 * | 6/2006 | Tell et al. | 375/376 |
| 2007/0075759 A1 * | 4/2007 | Metz et al. | 327/158 |
| 2008/0143405 A1 * | 6/2008 | Bhullar et al. | 327/158 |
| 2008/0197830 A1 * | 8/2008 | Mehas et al. | 323/318 |
| 2008/0231352 A1 * | 9/2008 | Kurd et al. | 327/544 |
| 2008/0238390 A1 * | 10/2008 | Trivedi et al. | 323/283 |
| 2009/0167379 A1 * | 7/2009 | Mobin et al. | 327/149 |
| 2009/0179674 A1 * | 7/2009 | Tamura et al. | 327/155 |
| 2010/0117742 A1 * | 5/2010 | Da Dalt | 331/18 |
| 2010/0141328 A1 * | 6/2010 | Meninger et al. | 327/512 |

* cited by examiner

*Primary Examiner* — Lincoln Donovan
*Assistant Examiner* — Adam Houston
(74) *Attorney, Agent, or Firm* — Howison & Arnott, L.L.P.

(57) ABSTRACT

A circuit comprises a digital phase locked loop for generating a synchronization signal and a voltage regulator for providing regulated output voltage responsive to the synchronization signal from the digital phase locked loop.

14 Claims, 6 Drawing Sheets

| SIGN BIT | MAG | HALFMAG | INTERPRETATION |
|---|---|---|---|
| + | NON-ZERO | X (don't care) | +MAG |
| - | NON-ZERO | X (don't care) | -MAG |
| + | ZERO | 1 | +1/2 MIN |
| - | ZERO | 1 | -1/2 MIN |
| X (don't care) | 0 | 0 | ZERO (no correction) |

METHOD FOR USING DIGITAL PLL IN A VOLTAGE REGULATOR

CROSS-REFERENCE TO RELATED APPLICATIONS

This application is a continuation of U.S. application Ser. No. 11/951,565, filed Dec. 6, 2007, now U.S. Pat. No. 7,592,846, issued Sep. 22, 2009, entitled METHOD FOR USING DIGITAL PLL IN A VOLTAGE REGULATOR, which claims benefit of U.S. Provisional Application Ser. No. 60/890,285, filed on Feb. 16, 2007, entitled METHOD FOR USING DIGITAL PLL IN A VOLTAGE REGULATOR; by Gustavo Mehas, Sandeep Agarwal, Jayant Vivrekar and Xiaole Chen, and U.S. Provisional Patent Application No. 60/890,286, filed on Feb. 16, 2007, entitled METHOD FOR PROGRAMMING AND CONTROLLING OVER CURRENT TRIP POINT LIMITS IN VOLTAGE REGULATORS; by Gustavo James Mehas, Atul Aokhlu, Naveen Jain and Xiaole Chen, both of which are incorporated herein by reference.

TECHNICAL FIELD

The present invention relates to voltage regulators, and more particularly, to the use of a digital phase locked loop with a voltage regulator.

BACKGROUND

Voltage regulator circuits are often required to synchronize to an external clock signal. The primary reason for the synchronization is to prevent beat frequencies from existing within the voltage regulator. These beat frequencies can cause significant data corruption and cause circuitry to emit electromagnetic interference (EMI) at undesired frequencies. Complexity is added when the synchronizing input signal is not a clean clock signal and additional complexity is provided when the signal is applied after the voltage regulator has already been activated. The synchronization feature must be provided over the entire operating range of the voltage regulator. When the voltage regulator goes into and out of synchronization, this should not cause a disturbance to the voltage loop of the regulator. Additionally, the voltage regulator must be able to provide a phase delay with respect to the input clock signal to enable staggering of output switching, thereby reducing the effect of simultaneously switching phases in case of multi-phase operation.

The external clock signal provided for the voltage regulator, is frequently not a clean signal. Unfortunately, the majority of existing voltage regulators do not provide a good clock signal as a standard output. As a result, the least functional voltage regulator on a circuit board will frequently be used as the master clock by providing its LG signal for the remaining voltage regulators to synchronize with.

The range of operation of a voltage regulator is critical as customers will often operate from a very low frequency of approximately 200 KHz for high efficiency requirements up to 2 MHz for small size considerations. As a result, a phase locked loop (PLL) must operate successfully over this range. In extreme cases, a design may even be required to start out a 2 KHz and synchronize to a 2 MHz clock input.

Due to voltage sequencing requirements, it is often necessary for a voltage regulator to be enabled prior to the master clock signal being applied. An instantaneous change in frequency causes a voltage deviation on the output of the voltage regulator due to clock stretching or compression. Due to a potential change in the steady state operation point of the control loop, the voltage regulators PLL bandwidth is preferably sufficiently low such that no disturbances are seen on the voltage loop.

Synchronization provides multiple benefits to the voltage regulator such as reductions in the EMI and data corruption, and reduction of BOM cost from input capacitor savings. These benefits have spurred existing solutions which use analog PLLs to provide synchronization capability. Analog PLLs have significant difficulty with providing the above benefits due to the difficulty of synchronizing with noisy clocks, requiring large silicon areas to support large operating frequency ranges, adding phase delays to the system and transitioning from an initial frequency to another frequency. As a result of these challenges, customers are dissatisfied with existing analog PLL solutions and there exists a need for an improved solution.

SUMMARY

A digital phase lock loop is used for generating a synchronization signal responsive to a provided reference signal and a feedback signal. The generated synchronization signal is provided to a voltage regulator that provides a regulated output voltage responsive to the synchronization signal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION

Referring now to the drawings, wherein like reference numbers are used herein to designate like elements throughout the various views, embodiments of the present invention are illustrated and described, and other possible embodiments of the present invention are described. The figures are not necessarily drawn to scale, and in some instances the drawings have been exaggerated and/or simplified in places for illustrative purposes only. One of ordinary skill in the art will appreciate the many possible applications and variations of the present invention based on the following examples of possible embodiments of the present invention.

Figure 1:
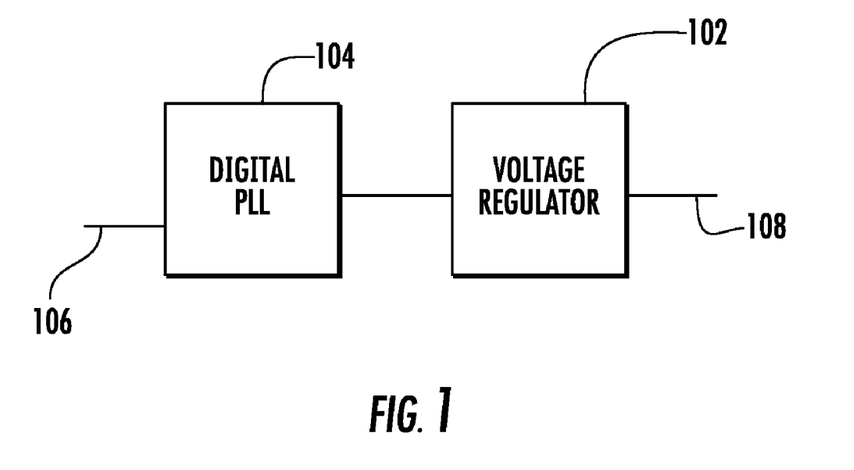
FIG. 1 is a block diagram of a voltage regulator including an associated digital phase locked loop.

Referring now to FIG. 1, there is illustrated a voltage regulator 102 having an associated digital phase locked loop 104. An external input 106 is used for receiving an external clock signal for synchronization of the phase locked loop 104. The external clock signal applied at input 106 is frequently not a clean clock signal. Unfortunately, the majority of voltage regulators 102 do not provide a good clock signal as a standard output. As a result, the least functional voltage regulator often is used to provide its LG signal as a synchronizing master clock for the other voltage regulators to provide synchronization. The phase locked loop then provides a synchronization signal to the regulator 102. The overall loop gain of the digital phase locked loop 104 is purposefully made low such that a large, random distribution of the input sync signal results in a very small change at the output of the phase locked loop. Thus, abrupt frequency changes at the input result in a slow and gradual change at the output of the phase locked loop as is desired for power management systems.

Figure 2:
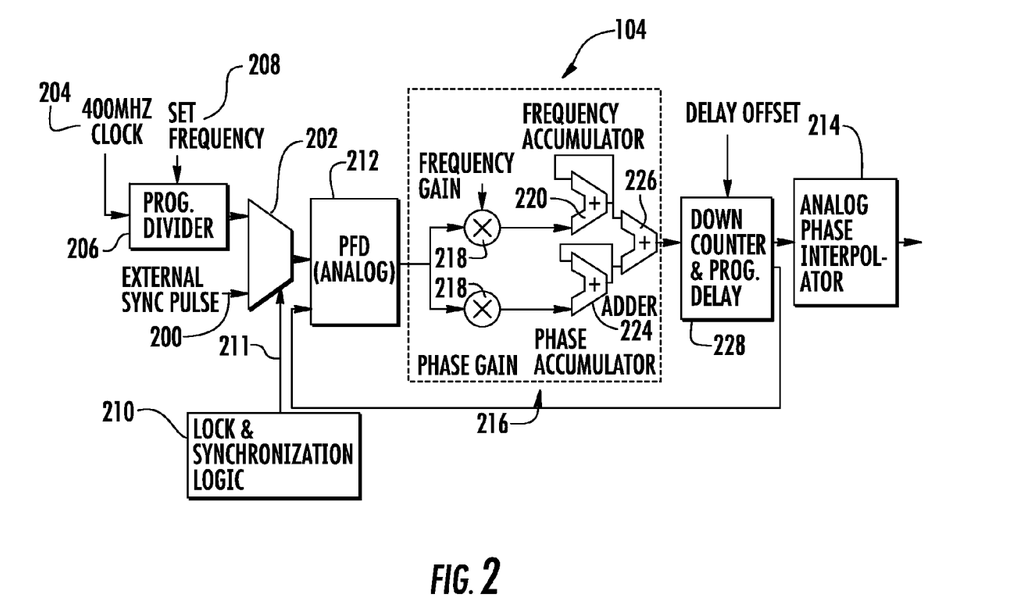
FIG. 2 is a block diagram of a digital phase locked loop.

Referring now to FIG. 2, there is illustrated a block diagram of a digital phase locked loop 104. The digital phase locked loop receives an external synchronization clock pulse signal on input 200 of a multiplexer 202. An internal clock signal is also applied to the multiplexer 202 using an internal 400 MHz clock signal 204 which is provided through a programmable divider circuit 206. Control inputs 208 of the programmable divider circuit 206 enable an applied 400 MHz clock signal at input 204 to be programmed to any number of desired frequency values. While the present description illustrates the use of the 400 MHz internal clock signal to the programmed divider 206, other frequency clock signals could also be used. The digital phase locked loop 104 is designed to synchronize to a reference signal comprising either external pulses from a master sync source applied to input 200 or an internal self-generated timing signal provided from the programmable divider 206 in the absence of a master synchronization source. The programmable divider 206 provides a programmed internal signal responsive to a set of control values applied via input 208. The programmable divider 206 generates the desired internal timing signals from the applied 400 MHz clock signal responsive to the control values.

The lock and synchronization logic 210 provides control signals to the multiplexer 202 to select either the external synchronization pulse or the internally generated synchronization pulse via control line 211. The lock and synchronization logic 210 ensures that the external sync signal is present and if a sync signal is not present, it switches the output of the multiplexer 202 to the internal synchronization signal. The signal selected by the lock and synchronization logic 210 using the multiplexer 202 is provided by the multiplexer 202 as the synchronization reference signal to the analog PFD (phase frequency detector). The block also contains logic to re-synchronize to the periodic external sync when it reappears and can therefore handle unsteady input sync sources seamlessly.

Figure 3:
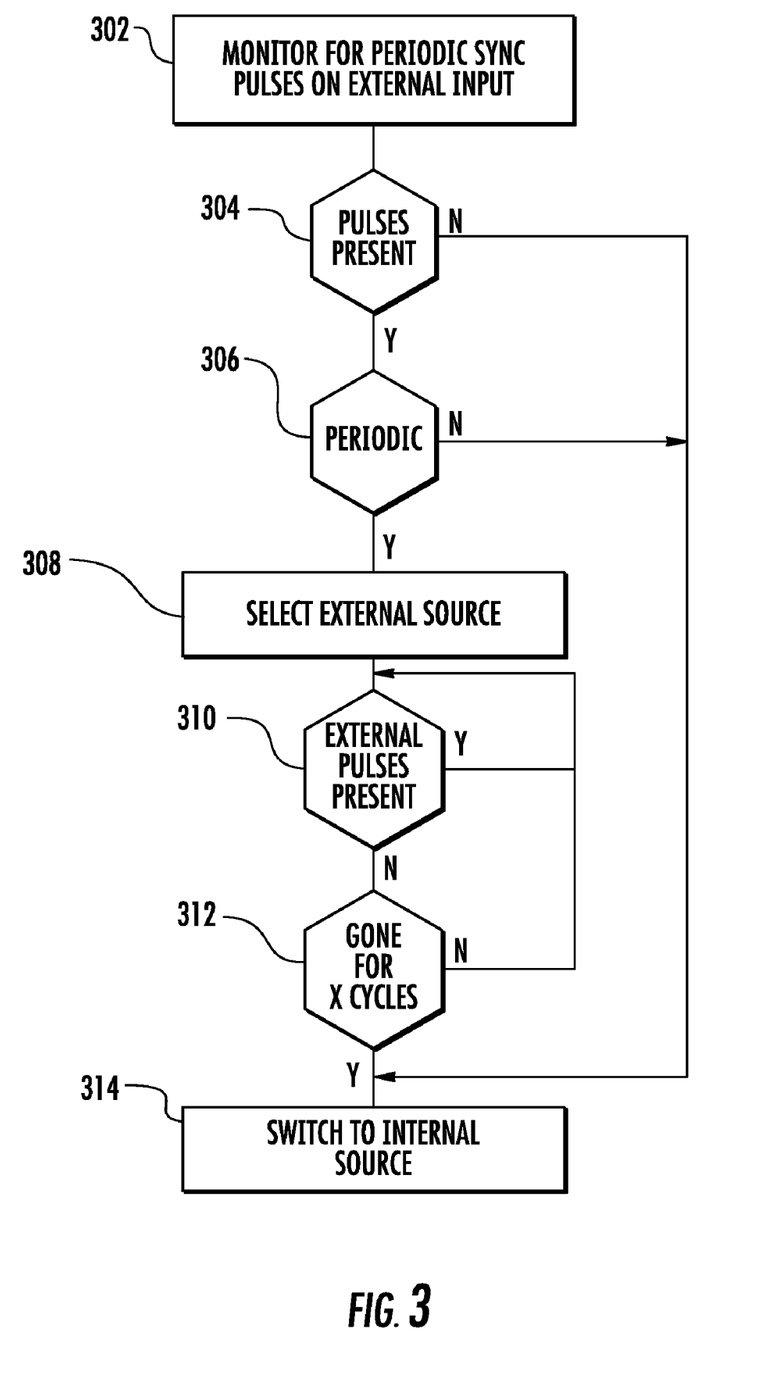
FIG. 3 is a flow diagram describing the operation of the lock and synchronization circuitry of the digital phase locked loop.

Referring now to FIG. 3, there is illustrated a flow diagram describing the operation of the lock and synchronization logic 210, and the manner in which it controls the multiplexer 202. The lock and synchronization logic 210 begins monitoring for periodic sync pulses on input 200 at step 302. Inquiry step 304 determines whether pulses are present on the external sync pulse input 200. If not, control switches to the internal synchronization source at step 314 from the program divider 206. If pulses are detected at inquiry step 304, inquiry step 306 makes a determination as to whether the pulses are periodic. If not, control passes to step 314 to switch to the internal source. If the signal pulses are periodic, the lock and synchronization logic 210 selects the external source for application to the PFD 212 at step 308.

Once the external source has been selected at step 308, the lock and synchronization logic 210 continues to monitor the external sync pulse input 200 to confirm that the external pulses are still present at inquiry step 310. Once inquiry step 310 determines that the external pulses are not present, inquiry step 312 determines whether the pulses have been gone for a selected number of clock cycles. If the pulses have not been gone for the selected number of clock cycles, control passes back to inquiry step 310 to continue monitoring for the presence or absence of the pulses on input 200. Once inquiry step 312 determines that the external pulses have been absent for the selected number of clock cycles, the lock and synchronization logic 310 switches, at step 314, to the internal pulse source for application to the analog PFD 212.

Referring now back to FIG. 2, the analog phase/frequency detector (PFD) 212 receives two inputs, a reference signal from the multiplexer 202 comprising the internal or external pulse signal and the other signal comprising a feedback signal from the downcounter and programmable delay circuit 228. The analog PFD 212 utilizes the provided reference signal from the multiplexer 202 and the feedback signal to detect a phase difference between these signals and convert this information into a digital format. This digital information is provided from the analog PFD 212 in a 50 MHz clock output. The digitized phase difference information is provided as a signed magnitude number at the output of the PFD 212 on each 50 MHz clock cycle. The digital representation chosen for one embodiment is a value between +24 to −24. However, the digital representation could be more or less depending upon the desired accuracy of the phase difference detection. As a result, the analog PFD 212 is able to calculate up to $\frac{1}{24}$ of a 50 MHz clock cycle phase difference between the two input signals.

The analog PFD 212 compares the reference signal received from the multiplexer 202 and the feedback signal from the downcounter and programmable delay 228 to determine a phase difference between the signals in digital format. The phase difference is calculated accurately up to $\frac{1}{3}$ of the 400 MHz external clock signal or up to an accuracy of 833 PS (picoseconds). The output of the analog PDF block 212 includes a single bit representing the sign of the phase difference, a number of bits representing the magnitude (MAG) of the phase difference and for further accuracy, a bit called "HALFMAG". The HALFMAG bit is used to detect phase differences smaller than 833 PS. The digital controller block 104 (FIG. 2) applies a minimum correction to the phase difference in such situations.

Figure 4:
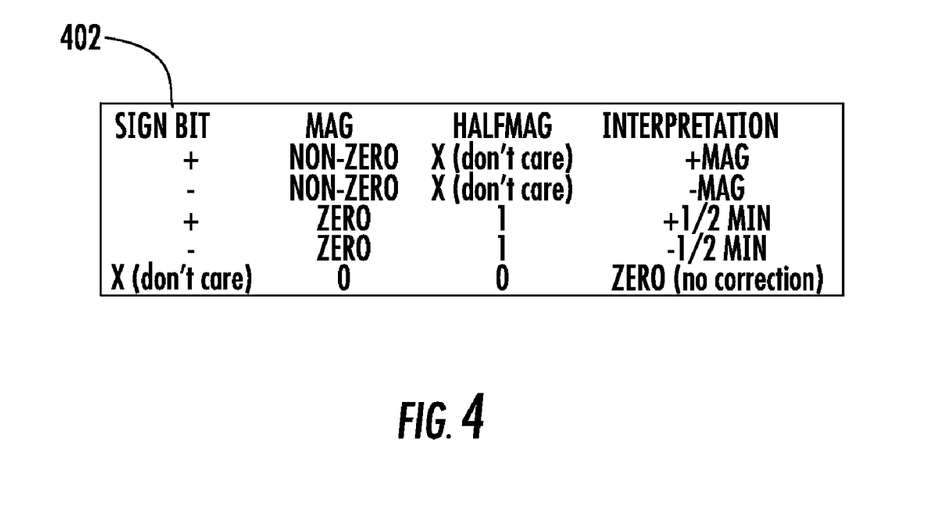
FIG. 4 illustrates a truth table of the manner in which the arithmetic and controller block interprets the signals from the PFD of the phase locked loop.

The truth table of FIG. 4 illustrates how the down converter and programmable delay circuit 228 interprets the signals from the analog PFD 212. The sign bit 402 indicates whether the magnitude (MAG) 404 or HALFMAG 406 values that follows is an added or subtracted phase difference between the reference and feedback signals. The plus sign bit indicates an increase in the phase difference and a negative sign bit indicates the decrease in the phase difference. Logic 1 or 0 may be used to indicate either the + or − bits respectively. Additionally, an X bit indicates a don't care condition with respect to the sign bit value due to the value of the remaining bits. When the sign bit is +, the MAG bits are a nonzero value and the HALFMAG bit is an X (don't care value), this provides an indication that the phase difference is to be increased by the MAG value. If the sign bit is negative, the MAG bit is a nonzero value and the HALFMAG bit is an X value (indicating don't care), this is an indication that the phase difference is to be subtracted by the MAG value. If the sign bit indicates a positive value and the MAG bits indicate a zero value while the HALFMAG bits have a 1 value, this indicates that the phase difference should be increased by one half the minimum phase difference value. Likewise, if the sign bit is a negative value, the MAG bits are a zero value and the HALFMAG bit is a 1, this provides an indication that the phase difference should be decreased by one half the minimum phase difference value. Finally, if the MAG value bits indicate zero and the HALFMAG bits are also zero, a don't care condition exists with respect to the value of the sign bits 402 and this indicates a zero change in the phase difference (i.e., no phase correction).

Figure 5:
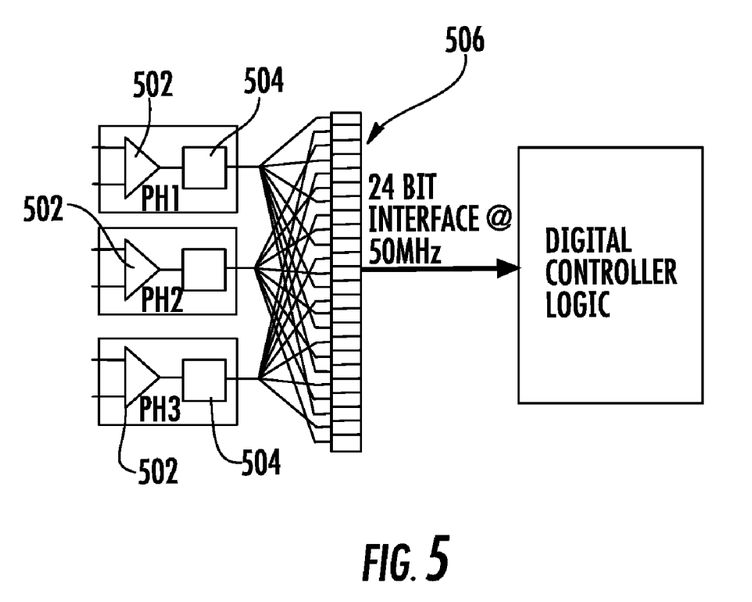
FIG. 5 is a block diagram illustrating the manner in which the phase difference is stored within the PFD block of the digital phase locked loop.

Referring now back to FIG. 2, since the PFD block 212 calculates the phase difference on three phase 400 MHz clocks (833 PS), this phase difference value must be accumulated and conveyed to digital filter 216 and downcounter and programmable delay logic 228 for each phase. This circuitry preferably operates on a 50 MHz (20 nanoseconds) clock and utilizes the output of the PFD block 212 once every 20 nanoseconds. The number of bits needed to communicate the information from the PFD block 212 in one shot would be 20 nanoseconds/2.5 nanoseconds/3=24 bits. If the phase difference is stored in a set of 24 bit mirrored flip-flops and updated every 20 nanoseconds, the interface timing is simplified to a large extent. This circuitry configuration for the analog PFD 212 is illustrated in FIG. 5. The reference and feedback signals are applied to separate inputs of comparator logic 502 for each of the three separate phases. Control logic 504 enables determination of the phase differences between the signals. The 24 mirrored flip-flops 506 are then used to store the phase difference information. Other schemes could be adopted which would result in a lower width high speed interface between the analog PFD 212 and the remainder of the digital logic. Regardless of the scheme selected, the result in phase difference would be 5 bits in magnitude (MAG), 1 bit for the sign and another bit for the HALFMAG signal indication. This would support a count of up to +24 or −24.

The loop filter 216 includes gain controllers 218, a frequency accumulator 220, a phase accumulator 222, an adder circuit 226 and downcounter and program delay block 228. The digital phase information from the analog PFD 212 is applied to the input of the frequency gain controller 218a and the phase gain controller 218b. The frequency gain controller 218a also receives a gain control input signal that will enable the applied signal from the analog PFD 212 to be gained up or down. Similarly, the phase gain control block 218b receives a phase gain input that enables the signal applied from the analog PFD 212 to be gained up or gained down.

A frequency accumulator circuit 220 is connected to the output of the frequency gain block 218a and a phase accumulator block 224 is connected to the output of the phase gain block 218b. The frequency accumulator block 220 accumulates the frequency of the applied phase difference signals. The phase accumulator 224 accumulates the phases of the applied phase difference signals. The outputs of both the frequency accumulator 220 and the phase accumulator 224 are connected to inputs of an adder circuit 226. Additionally, the output of frequency accumulator 220 is connected to a second input of the frequency accumulator, and the output of the phase accumulator 224 is also connected to a second input of the phase accumulator.

The only difference between the phase correction path and the frequency correction path is that the phase accumulator 224 is reset after each occurrence of an input reference signal from the phase gain controller 218b or at every output sync as established by a programmable option. If the gain of the digital phase information has been increased by the frequency gain control block 218a and phase gain control block 218b, the respective frequency accumulator 220 and phase accumulator 224 will build up faster and the frequency buildup or block process is speeded up. Likewise, the buildup or block process is slowed down within the frequency accumulator 220 and phase accumulator 224, if the digital phase information is gained down by the frequency gain controller 218a and phase gain controller 218b. The gain ranges and the precision of the output of the frequency accumulator 220 and phase accumulator 224 are such that no information is lost across the range of gain. For the present embodiment, a gain range of 1/32 to 256 is provided in steps of 2× increments to provide a wide range of adjustments for the digital phase locked loop settling characteristics.

The frequency accumulator 220 is not periodically reset and accumulates the frequency throughout the operation of the digital phase locked loop 104. Lower and upper frequency bounds limit the output of the digital phase locked loop 104 and prevent it from becoming unstable. The outputs of the frequency accumulator 220 and phase accumulator 224 are added together by the adder circuit 326 to provide a final value (Pnum) that is applied to the downcounter and programmable delay block 228. The downcounter and programmable delay logic 228 uses the Pnum value to establish a counter value for a counter within the downcounter logic 228. The Pnum value counter is decremented by a fixed precision count each time a clock cycle occurs within the phase locked loop 104. When the Pnum value counter goes below the value of the fixed precision count, the downcounter and programmable delay circuit 228 generates an output pulse to the analog phase integrator 214 and as the feedback signal to the analog PFD 212. A new and updated value of Pnum is then loaded from the adder 226 into the downcounter and programmable delay circuit 228 after the pulse.

Figure 6:
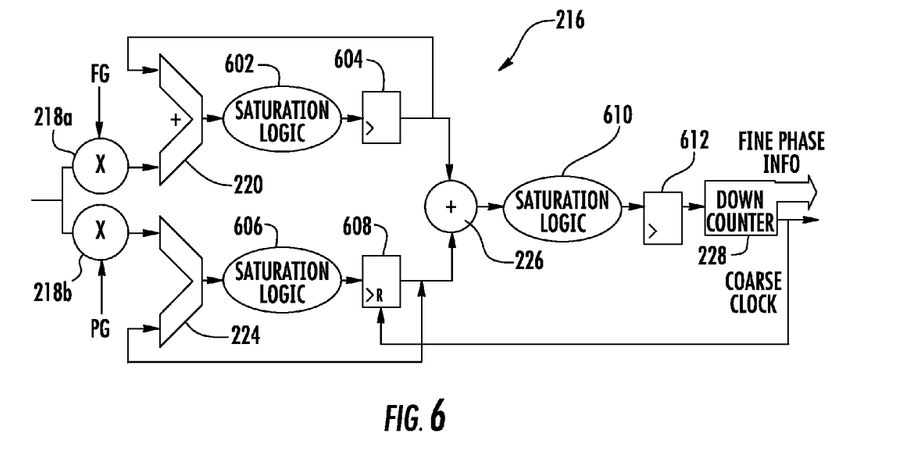
FIG. 6 is a block diagram illustrating the loop filter of the digital phase locked loop.

Referring now to FIG. 6, there is more fully illustrated a block diagram of the loop filter 216. As described previously, the frequency gain controller 218a provides a gain adjusted signal to a first input of the frequency accumulator 220. The second input of the frequency accumulator 220 comes from the output thereof that has been passed through saturation logic 602 to prevent saturation of the output of the frequency accumulator 220 and a latch circuit 604 that latches the output the accumulator 220 for each clock cycle. The latched output is provided to the second input of the frequency accumulator 220. The latched output from latch circuit 604 is also applied to the adder circuit 226. The phase path signal is applied to the phase gain controller 218 which is gain controlled to a desired level and applied to a first input of the phase accumulator 224. The second input of the phase accumulator 224 is applied from a latched output signal of the phase accumulator that is passed through saturation logic 606 and a latch circuit 608. The latched output of the phase accumulator 224 is applied to the adder circuit 226 where it is added with the frequency accumulated signal and the result output through saturation logic 610 to a latch circuit 612. As described previously, the output of the adder circuit 226 comprises the value Pnum, and the latched value of Pnum from latch circuit 612 is provided to a downcounter circuit 228. The coarse clock output of the downcounter circuit 228 comprises the clock pulse from the downcounter circuit 228 each time the Pnum value is goes below the value of fixed precision count. This coarse clock pulse is also provided to the latch 608 connected to the output of the phase accumulator 224 to reset the latch upon each coarse clock output pulse.

The loop filter 216 ensures that output clock changes are not abrupt and are made over several hundred clock cycles. The frequency and phase gain values are programmable through the default values applied to the gain control block 218 to work across the range of output frequencies. Input from the analog PFD 212 will be converted to a six bit signed number (1-bit sign, 5-bit magnitude) (range + or −24) and a HALFMAG bit. Assuming $\Phi_n$ is the unit phase difference between the feedback signal and the input timing signal. The smallest unit of phase difference that can be measured by the analog PFD 212 is ⅓ of the 400 MHz clock which is:

$$\Delta T_{in} = K\Phi_n \quad \text{(I), where K is a constant defined by}$$

$$K = T_{50}/24 \quad \text{(II)}$$

The Pnum is a number in the DPLL downcounter circuit 228 which is decremented every 50 MHz clock cycle by an amount equal to 2**N, and on an underflow, an output pulse is generated. By design, we make the Pnum of the PLL accumulator proportional to $T_{out}$, and the precision part of the accumulator has N bits of precision plus M bits of magnitude. Then:

$$T_{out} = Pnum * T_{nco}/2^N \quad \text{(IIIa)}$$

$$\Delta T_{out} = Pnum * T_{nco}/2^N \quad \text{(IIIb)}$$

For loop gain calculations, let us say $G_F$ is the frequency amplification factor for every unit phase difference $\Phi_n$. There is also a gain factor of "2" to take care of the HALFMAG type of situation when the input phase difference is infinitesimally small.

$$\Delta Pnum = 2\Phi_n G_F, \quad \text{(IV)}$$

Substituting in (IIIb)

$$\Delta T_{out} = 2 2 \Phi_n G_F T_{nco}/2^N \quad \text{(V)}$$

Loop gain, or transfer function of the loop is defined by $\Delta T_{out}/T_{in}$ $$\text{Loop Gain} = \frac{2\Phi_n G_F T_{nco}}{2^N K \Phi_n}$$

Which on simplification yields
Loop Gain=48 $G_F/2^N$
For N=16, and GF=1.0 (roughly midpoint of gain selection range), say
Loop Gain=1/1365 (approx)

This is approximately equal to the requirement that the output need to change over about a thousand cycles.

To calculate the magnitude part of the arithmetic, we need to consider the largest value of the ratio $$T_{out}/T_{in} = Pnum/2^N$$

Smallest frequency is 100 KHz or 1 us and so the ratio $T_{out}/T_{nco} = 500$, Therefore Pnum magnitude has to be at least 9 bits. Therefore the Pnum format is:

| 9 bit magnitude | 16 bit precision |
|---|---|

The accumulators on the frequency path and the phase path are similar except for the fact that the phase accumulator 224 resets every output pulse and the frequency accumulator 220 does not. The sum total of the frequency and the phase paths are applied to the downcounter 228 which is decremented by a fixed precision value (2**16, in this case) and the 9-bit magnitude counter counting to zero or underflowing creates an output pulse. The downcounter block 228 (down converter and programmable delay block) contains a programmable output delay stage. For power management applications, it is desirable to run several slave modules from a single master module but, as described above, large undesirable switching transients occur if all of the slaves are synchronized and not phase shifted. The programmable output delay block 228 provides a mechanism to insert a phase delay from 30 degrees to 330 degrees in programmable 30 degree steps. The delay module of the circuit 228 provides this coarse delay in terms of a 50 MHz clock, but due to the wider data path, detailed phase information is also available, which is passed on to the analog phase interpolator 214 for final phase interpolation. While the delayed output goes to the analog phase interpolator 214, the non-delayed output goes back to the analog PFD 212 as a feedback signal for comparison. The analog phase interpolator 214 receives the raw coarsely delayed sync signal from the downcounter block 228 along with the phase information in 5-bits according to the present implementation. The analog phase interpolator 214 delays the incoming sync signal appropriately based on the 5-bit fine phase input, effectively running at a 1.2 GHz frequency. The output of the analog phase interpolator 214 is accurately delay synced and can now be used for purposes of PWM generation and provided to the voltage regulator 102 as illustrated in FIG. 1.

Figure 7:
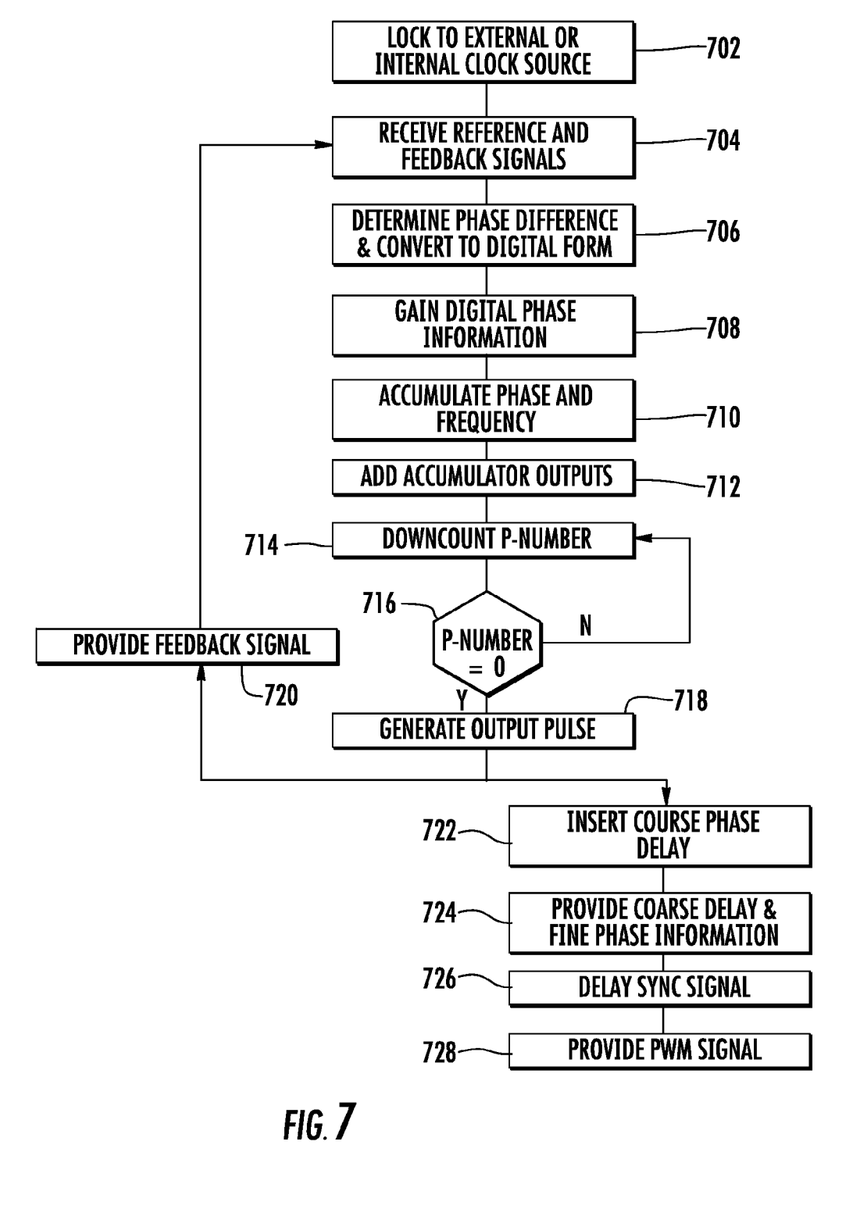
FIG. 7 is a flow diagram illustrating the operation of the digital phase locked loop.

Referring now to FIG. 7, there is provided a flow diagram describing the operation of the phase locked loop circuit described with respect to FIG. 2. Once the synchronization is initialized, the phase locked loop will lock to either the external or internal clock source at step 702 in the manner described previously with respect to FIG. 3. This is accomplished using the lock and synchronization logic 210. The analog PFD 212 receives a reference signal from the multiplexer 202 and a feedback signal from the downcounter and programmable delay logic 228 at step 704. The analog PFD 212 uses these signals to determine a phase difference between the signals and convert them to a digital format including the 5 bit magnitude signal, the single bit sign and the 1 bit HALFMAG signal at step 706. This output is provided from the analog PFD 212 on every 50 MHz clock cycle.

The digital phase output of the analog PFD 212 is gain controlled at step 708 within the frequency and phase paths of the digital filter 216. Within the frequency and phase correction paths, the phase and frequency are each accumulated at step 710 by the frequency and phase accumulators 220 and 224, respectively. The outputs of the frequency accumulator 220 and phase accumulator 224 are added together at step 712 by the adder circuit 226. The output of the adder 226 comprises the digital value Pnum which is provided to a downcounter circuit within the downcounter and programmable delay logic 228 and used as a counter value within the downcounter at step 713. The Pnum counter value is down counted at step 714 during each clock cycle of the digital filter 216. At inquiry step 716, the downcounter circuit 228 determines if the magnitude part of the Pnum value has gone to 0. If not, the value is decremented again at step 714. Once the magnitude part of Pnum value equals 0, an output pulse is generated by the downcounter circuit at step 718. Coarse phase delay information is inserted into the pulse signal at step 722 by the output programmable delay circuit 228 and any fine phase information is provided to the analog phase interpolator 214. The analog phase interpolator delays the synchronization signal precisely in accordance with the delay information and provides a signal which may be provided as a PWM control signal to a voltage regulator at step 228.

The described system provides significant improvement over the existing prior art. Analog phase locked loops require very large capacitors to operate at low frequencies. However, digital phase locked loops are able to achieve better performance with smaller amounts of silicon area in modern sub-micron processes. Digital phase locked loops also greatly ease the transition from operating an internal clock to operating an external clock and back again compared to analog phase locked loops. It is also possible to compensate for pulse skipping which can cause analog phase locked loops to lock on to a lower frequency. By utilizing a digital phase locked loop, the impact of jitter on the input signal be precisely and reliably controlled. Finally, digital phase locked loop provides significant flexibility and phase alignment, both when receiving a master clock, and when sending out a master clock to a recipient circuit.

It will be appreciated by those skilled in the art having the benefit of this disclosure that this invention provides digital phase locked loops for a voltage regulator. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A digital phase locked loop circuit, comprising:
  at least one input for receiving a reference signal;
  a phase frequency detector for determining a phase difference between the reference signal and a feedback signal and generating a digital representation of an amount of the phase difference between the reference signal and the feedback signal;
  a digital filter circuit for generating a counter value responsive to the digital representation of the phase difference;
  a counter circuit for generating an output pulse including coarse phase information and fine phase information each time the counter circuit goes below a predetermined value, wherein an initial counter value is established responsive to the counter value;
  wherein the feedback signal is established responsive to the coarse phase information;
  an analog phase interpolator for generating a synchronization signal responsive to the coarse phase information and the fine phase information; and
  an output for providing the synchronization signal to a switching voltage regulator to enable generation of a PWM signal at the switching voltage regulator.

2. The digital phase locked loop circuit of claim 1, further including circuitry for providing the reference signal, the circuitry enabling selection of either an external synchronization pulse or an internal synchronization pulse.

3. The digital phase locked loop circuit of claim 2, wherein the circuitry for providing the reference signal further comprises:
  a multiplexer connected to receive the external synchronization pulse and the internal synchronization pulse and provide the reference signal as an output responsive to a control signal;
  a programmable divider circuit for generating the internal synchronization pulse from an internally provided clock signal, a frequency of the internal synchronization pulse established by a selectable input to the programmable divider circuit; and
  control logic for providing the control signal enabling the multiplexer to select between the external synchronization pulse and the internal synchronization pulse.

4. The digital phase locked loop circuit of claim 1, wherein the digital filter circuit further comprises:
  a frequency circuit path for accumulating a frequency of the digital representation of the phase difference;
  a phase circuit path for accumulating a phase of the digital representation of the phase difference; and
  an adder circuit for adding the accumulation from the frequency circuit path with the accumulation from the phase circuit path to generate the counter value.

5. The digital phase locked loop circuit of claim 4, wherein the frequency circuit path further comprises:
  a first gain circuit for selectively gain controlling the digital representation of the phase difference; and
  a first accumulator circuit for accumulating a frequency of the gain controlled digital representation of the phase difference.

6. The digital phase locked loop circuit of claim 4, wherein the phase circuit path further comprises:
  a second gain circuit for selectively gain controlling the digital representation of the phase difference; and
  a second accumulator circuit for accumulating a phase of the gain controlled digital representation of the phase difference.

7. The digital phase locked loop circuit of claim 6, wherein the analog phase interpolator generates the delayed synchronization signal by applying the fine phase information to the coarse phase information.

8. An apparatus, comprising:
  a digital phase locked loop circuit for generating a synchronization signal, wherein the digital phase locked loop circuit further comprises:
  at least one input for receiving a reference signal;
  a phase frequency detector for determining a phase difference between the reference signal and a feedback signal and generating a digital representation of an amount of the phase difference between the reference signal and the feedback signal;
  a digital filter circuit for generating a counter value responsive to the digital representation of the phase difference;
  a counter circuit for generating an output pulse including coarse phase information and fine phase information each time the counter circuit goes below a predetermined value, wherein an initial counter value is established responsive to the counter value;
  wherein the feedback signal is established responsive to the coarse phase information;
  an analog phase interpolator for generating a synchronization signal responsive to the coarse phase information and the fine phase information;
  an output for providing the synchronization signal to a switching voltage regulator to enable generation of a PWM signal at the switching voltage regulator; and
  a voltage regulator for providing a regulated voltage, wherein a PWM signal of the voltage regulator is generated responsive to the synchronization signal.

9. The apparatus of claim 8, further including circuitry for providing the reference signal, the circuitry enabling selection of either an external synchronization pulse or an internal synchronization pulse.

10. The apparatus of claim 9, wherein the circuitry for providing the reference signal further comprises:
  a multiplexer connected to receive the external synchronization pulse and the internal synchronization pulse and provide the reference signal as an output responsive to a control signal;
  a programmable divider circuit for generating the internal synchronization pulse from an internally provided clock signal, a frequency of the internal synchronization pulse established by a selectable input to the programmable divider circuit; and control logic for providing the control signal enabling the multiplexer to select between the external synchronization pulse and the internal synchronization pulse.

11. The apparatus of claim 8, wherein the digital filter circuit further comprises:

a frequency circuit path for accumulating a frequency of the digital representation of the phase difference;

a phase circuit path for accumulating a phase of the digital representation of the phase difference; and an adder circuit for adding the accumulation from the frequency circuit path with the accumulation from the phase circuit path to generate the counter value.

12. The apparatus of claim 11, wherein the frequency circuit path further comprises:

a first gain circuit for selectively gain controlling the digital representation of the phase difference; and a first accumulator circuit for accumulating a frequency of the gain controlled digital representation of the phase difference.

13. The apparatus of claim 11, wherein the phase circuit path further comprises:

a second gain circuit for selectively gain controlling the digital representation of the phase difference; and a second accumulator circuit for accumulating a phase of the gain controlled digital representation of the phase difference.

14. The digital phase locked loop circuit of claim 8, wherein the analog phase interpolator generates the delayed synchronization signal by applying the fine phase information to the coarse phase information.

* * * * *